(12) United States Patent
Nishio

(10) Patent No.: US 7,892,444 B2
(45) Date of Patent: Feb. 22, 2011

(54) PLASMA PROCESSING APPARATUS AND METHOD FOR CONTROLLING THE SAME

(75) Inventor: Ryoji Nishio, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 640 days.

(21) Appl. No.: 11/696,263

(22) Filed: Apr. 4, 2007

(65) Prior Publication Data

US 2007/0210032 A1    Sep. 13, 2007

Related U.S. Application Data

(62) Division of application No. 11/036,097, filed on Jan. 18, 2005, now abandoned.

(30) Foreign Application Priority Data

Nov. 26, 2004    (JP) ................ 2004-341723

(51) Int. Cl.
  *G01L 21/30*    (2006.01)
  *G01R 31/00*    (2006.01)
(52) U.S. Cl. ...................................... 216/59
(58) Field of Classification Search .............. 216/59; 156/345.24, 345.28; 118/723 E
  See application file for complete search history.

(56) References Cited

U.S. PATENT DOCUMENTS 5,116,482 A * 5/1992 Setoyama et al. ...... 204/298.08

2003/0111180 A1 * 6/2003 Nagahata et al. ....... 156/345.47

FOREIGN PATENT DOCUMENTS

| JP | 2001-127045 | 5/2001 |
|---|---|---|
| JP | 2001-338917 | 12/2001 |
| JP | 2002-184766 | 6/2002 |
| JP | 2004-111432 | 4/2004 |

* cited by examiner

*Primary Examiner*—Roberts Culbert
(74) *Attorney, Agent, or Firm*—Antonelli, Terry, Stout & Kraus, LLP.

(57) ABSTRACT

A method for controlling a plasma processing apparatus which includes a vacuum vessel, a first, second and third RF power supply, a first and second electrode, and a phase control unit for controlling a phase difference between a second RF voltage from the second RF power supply and a third RF voltage from the third RF power supply. The controlling method includes the steps of supplying a predetermined power from the first RF power supply to ignite plasma, after confirming ignition of plasma, supplying a predetermined power respectively from the second RF power supply and the third RF power supply, and when starting power supply from the second RF power supply and the third RF power supply, fixing the phase to a predetermined phase angle using a preset mode without carrying out phase control, and after a matching operation has stabilized, starting the phase control.

1 Claim, 10 Drawing Sheets

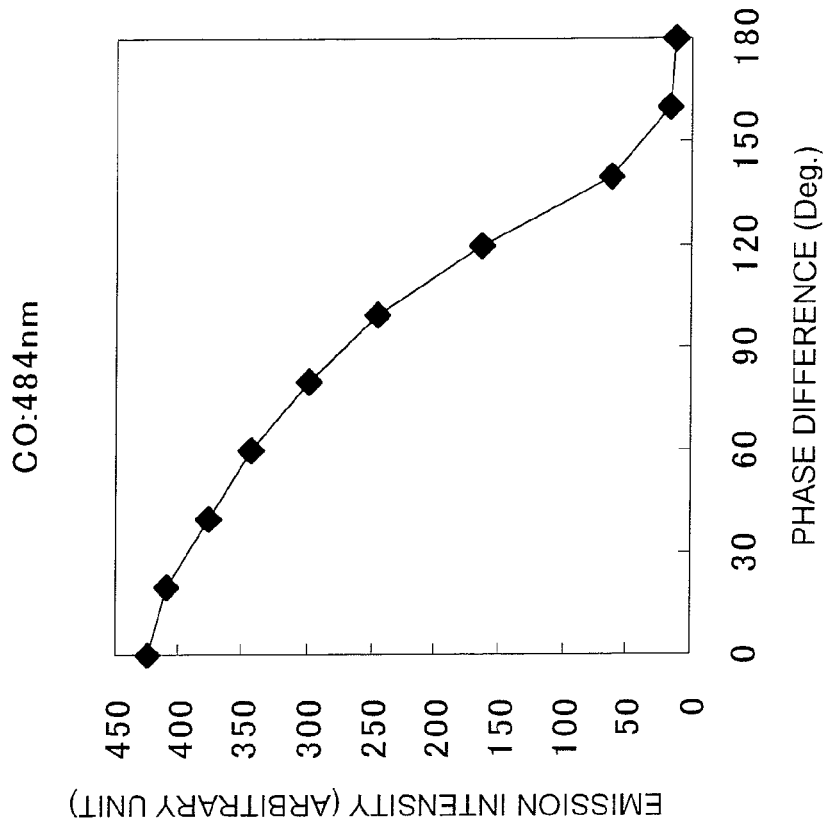
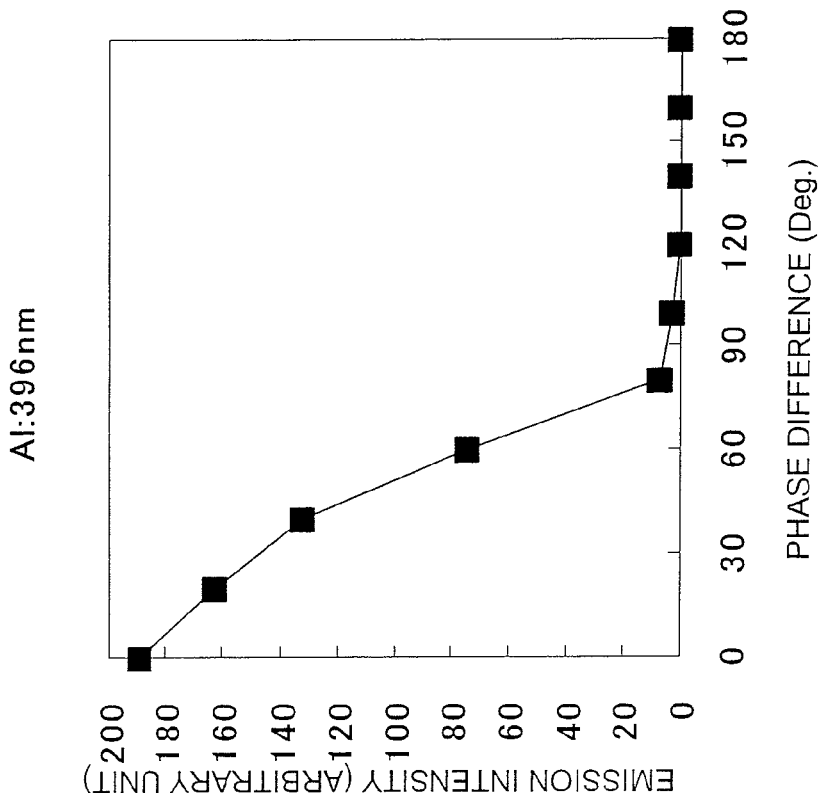
FIG.6(b)
FIG.6(a)

PLASMA PROCESSING APPARATUS AND METHOD FOR CONTROLLING THE SAME

CROSS REFERENCE TO RELATED APPLICATION

This application is a divisional application of U.S. application Ser. No. 11/036,097, filed Jan. 18, 2005 now abandoned, the contents of which are incorporated herein by reference.

The present application is based on and claims priority of Japanese patent application No. 2004-341723 filed on Nov. 26, 2004, the entire contents of which are hereby incorporated by reference.

BACKGROUND OF THE INVENTION

1. Field of the Invention

The present invention relates to an art for manufacturing semiconductor devices. Specifically, the present invention relates to a plasma processing apparatus and a method for controlling the plasma processing apparatus suitable for carrying out a plasma processing of a semiconductor wafer using plasma.

2. Description of the Related Art

Along with the recent trend of large-scale integration of semiconductor devices, the circuit patterns have become finer and finer, and the demands for accurate dimension processing have become very strict. Further, the wafer diameter has become as large as 300 mm with the aim to reduce manufacturing costs of the semiconductor devices, so there are also demands for uniformizing the plasma in a large area from the center of the wafer to the outer circumference thereof in order to enable uniform and high quality processing and to thereby improve the yield factor. Simultaneously, there exists demands for reducing contaminants and to reduce the contamination of wafers caused by metal materials etc. that are generated and scattered by sputtering.

A prior art method that achieves these objects is disclosed in Japanese Patent Application Laid-Open Publication No. 2001-127045 (patent document 1), which discloses a parallel plate plasma generating apparatus comprising an upper metallic plate electrode and a lower wafer (that functions as an electrode), in which RF biases of the same frequency are applied to the upper electrode and the lower electrode (wafer), realizing a method for generating a uniform plasma by controlling the phase of the RF biases.

Further, Japanese Patent Application Laid-Open Publication Nos. 2002-184766 (patent document 2) and 2004-111432 (patent document 3) disclose methods for improving the uniformity of plasma, reducing the amount of contaminants and reducing the charging damage by controlling the phase of the RF between upper and lower biases so that either the upper electrode or the lower electrode constantly functions as an earth.

On the other hand, as disclosed in Japanese Patent Application Laid-Open Publication No. 2001-338917 (patent document 4), it is known that with respect to the influence that an RF transmission path has on the voltage, current and phase difference of RF, the RF waveforms differ between the wafer and the output portion of an RF matching network, so it is effective to use a wafer potential probe to directly measure the wafer potential in order to acquire information on the wafer potential.

However, according to the prior art, there are a means for detecting and a means for adjusting the phase difference of the RF between upper and lower biases, and though it is stated that the phase difference should preferably be controlled to 180 degrees, there is no disclosure on how to guarantee the achievement of the object by phase control. For example, it is stated in the prior art that the object is to improve the uniformity of plasma, but the actual means for guaranteeing the uniformity of plasma via phase control is not made clear. The same can be said for reduction of the generation of contaminants and charging damage.

The second drawback of the prior art is that even if the prior art method can be adopted to control the phase difference to 180 degrees, for example, it is not capable of guaranteeing that the phase difference of the voltages actually appearing at the upper and lower electrodes is 180 degrees. According to the methods mentioned above, the phase data is taken at the matching network of the circuit for applying RF biases to the upper and lower electrodes. However, the RF applied to the upper and lower electrodes undergo various conditions after exiting the output unit of the matching network. Regarding the bias RF application circuit leading to the upper electrode, the RF exiting the output unit of the matching network passes an RF filter, and a separate RF circuit for generating plasma exists as a load of the bias RF circuit, and an RF transmission path leading to the upper electrode is unique to the upper electrode. On the other hand, regarding the bias RF application circuit leading to the lower electrode, a structure for mounting the wafer on the lower electrode and controlling the wafer temperature exists within a transmission path of the RF bias, an electrostatic chucking circuit exists as a load of the RF bias transmission path, and a mechanism for carrying the wafer and a cover protecting the same etc. exists as earth of the RF bias transmission path. Therefore, even if phase data is taken at each matching network of the upper and lower electrodes, the RF transmission paths that lead to the electrodes from the matching network vary, so there is no guarantee that the phase difference of the voltages generated at the electrodes is as controlled.

Another fact that influences the present problem is that the impedance of the RF transmission path leading to the earth seen from the upper electrode and the impedance of the RF transmission path leading to the earth seen from the lower electrode are not equal. The upper electrode sees as a part of the load the vacuum vessel wall, the lower electrode and the electric circuit connected thereto as earth, but the lower electrode sees the vacuum vessel wall, the upper electrode and the electric circuit connected thereto as a part of the load. As described earlier, the structure of the upper and lower electrodes and the electric circuits connected thereto are not equal, so the RF impedances of these loads obviously differ. Further, the area of the vacuum vessel wall seen by the upper electrode and that seen by the lower electrode are not equal, since the upper and lower electrodes are positioned in confronting relationship. Moreover, during processing, the plasma is generated near the upper electrode and is spread out toward the lower electrode, during which the property thereof is varied. Further, since wafer processing is progressed near the lower electrode, the large amount of reaction products generated from the wafer causes the status of plasma near the lower electrode to change drastically.

Accordingly, the impedance determined by the density and electron temperature of plasma near the upper electrode is not equal to the impedance determined by the density and electron temperature of plasma near the lower electrode. Since the upper and lower electrodes see via the plasma having different impedance an earth that is not of the same range, the impedances naturally differ.

Even further, as disclosed in patent document 2, when a magnetic field is applied to a part of or a whole of the vacuum vessel, the influence of this magnetic field causes the impedances of various RF paths leading from the upper and lower electrodes to the earths to differ, since a completely uniform magnetic field does not exist. It may be necessary to vary the various conditions of plasma when processing the wafer (such as the density, the electron temperature, the RF power generating the plasma, the gas species and gas pressure, the positional relationship of the upper and lower electrodes, and magnetic field conditions), which also causes the impedances of the various RF paths from the upper and lower electrodes to the earth to differ.

The phase shift caused by these power paths depend on the stray capacitance and coil component existing on the power paths, so the phase shift increases as the frequency becomes higher. Though it depends on the arrangement of the apparatus, in general, the effect of phase shift becomes significant at a frequency of 1 MHz or higher.

What is concluded from the above is that the phase difference of voltages generated at upper and lower electrodes is determined by the overall circuits of RF passing the electrodes and the frequency of the RF, and therefore, it is not possible according to the prior-art monitoring method to accurately control the phase difference during wafer processing.

The third drawback of the conventional method results from the fact that the voltage waveform of RF biases generated at upper and lower electrodes is not a sine wave, and the conventional methods were incapable of performing optimum value control. It is well known that an electrically nonlinear region called an ion sheath is generated on the front side of the electrode exposed to plasma. Nonlinear means that the current and voltage are not in proportional relationship, wherein the electron current flows into the electrode when the voltage is positive, and this voltage-current property of the electron current depends on the diffusion coefficient of the electron, which normally is the exponential function of the voltage. On the contrary, if the voltage is negative, the ion current flows into the electrode, but this current does not depend on voltage since it is a space-charge limited current, and is substantially constant. When RF is applied to this electrode, current will not flow in proportion to the RF voltage, and the voltage waveform will be deformed from the sine waveform, containing harmonics.

What is important with respect to the present invention is that since the properties of plasma differ at the surface of the upper and lower electrodes, the properties of the ion sheaths in these areas differ, and as a result, the amounts of distortion of the RF at the upper and lower electrodes (the degree and size of the harmonics) vary, or in other words, the waveforms of the voltages of electrodes vary. Actually, as disclosed in patent documents 2 and 3, the measured values of the physical quantities being the index of phase control, which are the maximum electrode voltage, the voltage charged on gate oxide film, $\delta Vdc$, and the peripheral ion saturation current density, are not optimized at 180 degrees which is the characteristic phase difference, but is displaced therefrom. The cause of this displacement is that the phase difference of the electrodes are not performed accurately since the impedances of the RF transmission paths differ, and since the current/voltage waveform of the electrodes are deformed due to harmonics.

The fourth drawback of the conventional art is that the apparatus for improving wafer processing via phase control is restricted to a parallel plate plasma source equipped with upper and lower electrodes. Various type of plasma sources are used in the industry such as an inductively coupled plasma source or an ECR plasma source, but the methods disclosed in the prior art cannot be applied to these plasma sources since they do not have two independent electrodes that are capacitively coupled with plasma.

SUMMARY OF THE INVENTION

In view of the problems mentioned above, the first object of the present invention is to provide a plasma processing apparatus and a method for controlling the plasma processing apparatus equipped with a function to utilize a most suitable signal for phase control, thereby solving drawbacks one through three mentioned above.

The second object of the present invention is to provide a plasma processing apparatus and a method for controlling the plasma processing apparatus equipped with the above function, that can be applied to a plasma source such as an inductively coupled plasma source having no two independent electrodes that are capacitively coupled with plasma, thereby solving the fourth drawback mentioned above.

The first object of the present invention can be achieved by assembling to a phase control circuit a signal that is most suitable for guaranteeing the aim of phase control. As a first actual example, with the object of controlling the phase difference of voltages of the upper and lower electrodes, probes are respectively connected to the upper and lower electrodes for measuring the phase difference directly, the achieved signal is subjected to computation, and the result is used as a control signal for carrying out the phase control.

Moreover, as a second actual example, with the object of suppressing sputtering and damage of the vacuum vessel wall and reducing the amount of contaminants caused thereby, a voltage probe is disposed around the target vacuum vessel to extract the RF signals transmitted from the upper and lower electrodes through plasma, and phase control is performed so as to minimize the voltage or to set the voltage to an appropriate value.

Further, as a third actual example, if it is desirable to remove deposits adhered on the vacuum vessel wall or desirable not to remove the deposits, the intensities of emission of various wavelengths specific to a number of substances being released into the plasma from the wall are measured to control the phase appropriately, so that the emission of substance to be removed is seen or so that the emission of substance that should not be removed is not seen.

The second object of the present invention is achieved by providing an electrode independent from the wafer that is capacitively coupled with plasma in a plasma source having only one independent electrode that is capacitively coupled with plasma, such as an inductively coupled plasma source.

The present invention provides a plasma processing apparatus comprising a vacuum vessel in which plasma is generated, a first RF power supply, a second RF power supply and a third RF power supply provided outside the vacuum vessel, a first electrode disposed either inside or outside the vacuum vessel to which a first RF voltage from the first RF power supply is supplied, a second electrode disposed inside the vacuum vessel, having an upper surface on which a sample is mounted, and to which a second RF voltage from the second RF power supply is supplied, a phase control unit for controlling a phase difference between the second RF voltage and a third RF voltage from the third RF power supply, and an RF radiation unit other than the second electrode that is capacitively coupled with the plasma generated inside the vacuum vessel, wherein the phase difference between the second RF voltage and the third RF voltage having a same frequency is controlled using a signal source other than a phase signal. Further according to the above plasma processing apparatus, the RF radiation unit is composed of one of the following: an antenna of a parallel plate electrode, a focus ring, a Faraday shield, or another electrode that are capacitively coupled with plasma. Moreover, the signal source other than the phase signal utilizes one of the following: an RF voltage, a plasma emission, or a combination of the RF voltage and the plasma emission. Even further according to the above plasma processing apparatus, the RF radiation unit is composed of one of the following: a combination of an antenna of a parallel plate electrode, a focus ring and another electrode; or a combination of a Faraday shield, a focus ring and another electrode.

The present invention provides a plasma processing apparatus comprising a vacuum vessel, a first RF power supply, a second RF power supply, a third RF power supply, a first electrode disposed inside the vacuum vessel to which a mixture of a first RF voltage from the first RF power supply and a third RF voltage from the third RF power supply is supplied, a second electrode disposed inside the vacuum vessel, having an upper surface on which a sample is mounted, and to which a second RF voltage from the second RF power supply is supplied, a phase control unit for controlling a phase difference between the second RF voltage and the third RF voltage, the second RF voltage and the third RF voltage having the same frequency, and a first phase detecting means for detecting the phase of the third RF voltage of the first electrode, and a second phase detecting means for detecting the phase of the second RF voltage of the second electrode, wherein based on the output from the first phase detecting means and the second phase detecting means, the phase difference between the second RF voltage and the third RF voltage is controlled.

The present invention provides a plasma processing apparatus comprising a vacuum vessel, a first RF power supply, a second RF power supply, a third RF power supply, a first electrode disposed inside the vacuum vessel to which a mixture of a first RF voltage from the first RF power supply and a third RF voltage from the third RF power supply is supplied, a second electrode disposed inside the vacuum vessel, having an upper surface on which a sample is mounted, and to which a second RF voltage from the second RF power supply is supplied, a phase control unit for controlling a phase difference between the second RF voltage and the third RF voltage, the second RF voltage and the third RF voltage having the same frequency, a voltage detecting means for detecting a potential of the RF being transmitted through a plasma at an inner wall surface of the vacuum vessel, and a phase difference computing means for computing the phase difference between the second RF voltage and the third RF voltage based on the detected voltage of the voltage detecting means, wherein the phase difference between the second RF voltage and the third RF voltage is controlled so that the output of the phase difference computing means takes a minimum or a specific value.

The present invention provides a plasma processing apparatus comprising a vacuum vessel, a first RF power supply, a second RF power supply, a third RF power supply, a first electrode disposed inside the vacuum vessel to which a mixture of a first RF voltage from the first RF power supply and a third RF voltage from the third RF power supply is supplied, a second electrode disposed inside the vacuum vessel, having an upper surface on which a sample is mounted, and to which a second RF voltage from the second RF power supply is supplied, a phase control unit for controlling a phase difference between the second RF voltage and the third RF voltage, the second RF voltage and the third RF voltage having the same frequency, and a plasma emission detecting means for detecting an emission status of plasma within the vacuum vessel, wherein the phase difference between the second RF voltage and the third RF voltage is controlled based on the status of the plasma emission.

The present invention provides a plasma processing apparatus comprising a vacuum vessel, a first RF power supply, a second RF power supply, a third RF power supply, a first electrode disposed inside the vacuum vessel to which a first RF voltage from the first RF power supply is supplied, a second electrode disposed inside the vacuum vessel, having an upper surface on which a sample is mounted, and to which a second RF voltage from the second RF power supply is supplied, a focus ring disposed on a circumference of the sample mounted on the second electrode and to which a third RF voltage from the third RF power supply is supplied, a phase control unit for controlling a phase difference between the second RF voltage and the third RF voltage, the second RF voltage and the third RF voltage having the same frequency, and a plasma emission detecting means for detecting an emission status of plasma within the vacuum vessel, wherein the phase difference between the second RF voltage and the third RF voltage is controlled based on the status of the plasma emission.

The present invention provides a plasma processing apparatus comprising a vacuum vessel, a first RF power supply, a second RF power supply, a third RF power supply, a first electrode disposed outside the vacuum vessel to which a first RF voltage from the first RF power supply is supplied, a second electrode disposed inside the vacuum vessel, having an upper surface on which a sample is mounted, and to which a second RF voltage from the second RF power supply is supplied, a Faraday shield disposed between the first electrode and the inner side of the vacuum vessel, and to which a third RF voltage from the third RF power supply is supplied, a phase control unit for controlling a phase difference between the second RF voltage and the third RF voltage, the second RF voltage and the third RF voltage having the same frequency, and a plasma emission detecting means for detecting an emission status of plasma within the vacuum vessel, wherein the phase difference between the second RF voltage and the third RF voltage is controlled based on the status of the plasma emission.

The present invention provides a plasma processing apparatus comprising a vacuum vessel, a first RF power supply, a second RF power supply, a third RF power supply, a first electrode disposed outside the vacuum vessel to which a first RF voltage from the first RF power supply is supplied, a second electrode disposed inside the vacuum vessel, having an upper surface on which a sample is mounted, and to which a second RF voltage from the second RF power supply is supplied, a Faraday shield disposed between the first electrode and the inner side of the vacuum vessel, a third electrode disposed inside the vacuum vessel, to which a third RF voltage from the third RF power supply is supplied, and being capacitively coupled with plasma, a phase control unit for controlling a phase difference between the second RF voltage and the third RF voltage, the second RF voltage and the third RF voltage having the same frequency, and a plasma emission detecting means for detecting an emission status of plasma within the vacuum vessel, wherein the phase difference between the second RF voltage and the third RF voltage is controlled based on the status of the plasma emission.

The present invention provides a method for controlling a plasma processing apparatus that comprises a vacuum vessel in which plasma is generated, a first RF power supply, a second RF power supply and a third RF power supply provided outside the vacuum vessel, a first electrode disposed either inside or outside the vacuum vessel to which a first RF voltage from the first RF power supply is supplied, a second electrode disposed inside the vacuum vessel, having an upper surface on which a sample is mounted, and to which a second RF voltage from the second RF power supply is supplied, and a phase control unit for controlling a phase difference between the second RF voltage and a third RF voltage from the third RF power supply, wherein the controlling method comprises the steps of supplying a predetermined power from the first RF power supply to ignite plasma, after confirming ignition of plasma, supplying a predetermined power respectively from the second RF power supply and the third RF power supply, and when starting power supply from the second RF power supply and the third RF power supply, fixing the phase to a predetermined phase angle using a preset mode without carrying out phase control, and after a matching operation has stabilized, starting the phase control.

The present invention provides a method for controlling a plasma processing apparatus that comprises a vacuum vessel in which plasma is generated, a first RF power supply, a second RF power supply and a third RF power supply provided outside the vacuum vessel, a first electrode disposed either inside or outside the vacuum vessel to which a first RF voltage from the first RF power supply is supplied, a second electrode disposed inside the vacuum vessel, having an upper surface on which a sample is mounted, and to which a second RF voltage from the second RF power supply is supplied, and a phase control unit for controlling a phase difference between the second RF voltage and a third RF voltage from the third RF power supply, wherein the controlling method comprises the steps of controlling the phase difference between the RF voltage of the second electrode and the third RF voltage having a same frequency using a signal source other than a phase signal, disposed between the second electrode and an RF radiation unit that is capacitively coupled with plasma, and when removing a deposition film inside the vacuum vessel, controlling the phase difference according to an amount of the deposition film.

According to the present invention, upon performing phase control of the voltage waveforms of the third RF power and the second RF power supplying bias to the processing substrate, the phase difference at each electrode radiating power to the plasma can be controlled with high accuracy, and as a result of controlling the ion energy colliding against the wall and the interaction between ion and wall, the amount of substance generated from the wall can be controlled from minimum to maximum. As a result, it becomes possible to provide a most suitable in-vessel environment for each process performed in the apparatus for processing a processing substrate via plasma. Moreover, this function can be realized in all types of apparatuses that generate plasma, not only in those utilizing a parallel plate plasma source.

BRIEF DESCRIPTION OF THE DRAWINGS

FIG. 6 is a graph showing the relationship between emission intensity of aluminum and phase difference, and a graph showing the relationship between emission intensity of carbon monoxide and phase difference;

DETAILED DESCRIPTION OF THE PREFERRED EMBODIMENTS

Figure 1:
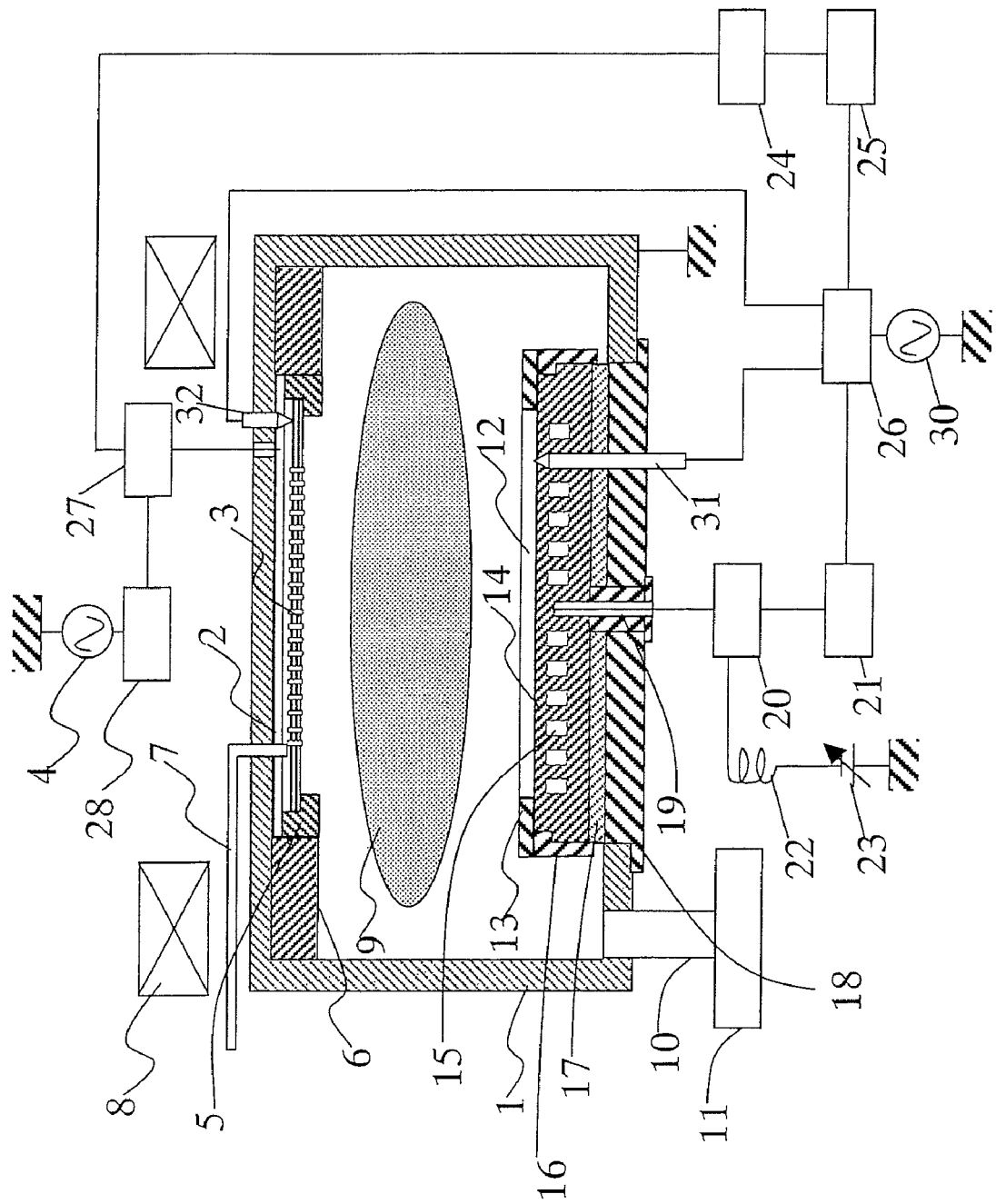
FIG. 1 is a schematic cross-sectional view showing the overall structure of a plasma processing apparatus according to a first embodiment of the present invention.

The overall structure of a plasma processing apparatus according to the present invention will now be described with reference to the schematic cross-sectional view of FIG. 1.

The plasma processing apparatus has a vacuum vessel 1 formed of conductive material such as aluminum, and in the vacuum vessel are attached an antenna 2 and a shower plate 3 via shower plate support flanges 5 and 6, respectively. The vacuum vessel 1 is grounded. Gas is supplied from the atmospheric side of the vessel through a process gas introduction pipe 7 to the space between the antenna 2 and the shower plate 3, and the gas is ejected into the vacuum vessel 1 through the many fine pores formed to the shower plate 3. Of course, the antenna 2 is formed of a conductive material, but the shower plate 3 can be formed of a conductive material, a dielectric material or a semiconductor material. When the shower plate 3 is formed of either conductive or semiconductor material, the shower plate 3 functions as an antenna for transmitting electric power directly to the plasma. The process gas is evacuated through an evacuation duct 10 and evacuated in the evacuation device 11, so that the gas pressure is maintained at a level appropriate for carrying out the process.

By supplying a predetermined power with a predetermined frequency from a first RF power supply 4 through a matching network 28 to the antenna 2, a plasma 9 having a property appropriate for carrying out the process is generated. A magnet (electromagnet) 8 can be used to control the property of plasma, but it is dispensable.

The above-described arrangement relates to a so-called capacitive coupled discharge, but according to the present invention, the discharge method can be of any type mentioned later such as ECR discharge or inductively coupled discharge, as long as it generates plasma having the desired property appropriate for carrying out the process. Of course, the structure of the discharge unit must correspond to the adopted discharge method, and the structure mentioned here is merely an example.

A wafer (processing substrate) 12 is transferred into the vacuum vessel 1 from the atmospheric side through an inlet (not shown), and placed on a processing electrode 14 by an appropriate carrier unit (not shown). On the upper surface of the processing electrode 14 is disposed an electrostatic chucking film (not shown) having an appropriate property, and the wafer is attracted electrostatically via a voltage applied thereto from an outside DC power supply 23 through a choke coil 22. Moreover, the processing electrode 14 is equipped with a refrigerant channel 15 formed within the electrode, into which refrigerant is supplied from the outside (not shown) to control the wafer 12 to an appropriate temperature for the process. A focus ring 13 and a susceptor 16 for protecting the processing electrode 14 from plasma 9 are disposed on the outer circumference of the wafer 12. The processing electrode 14 is attached to the vacuum vessel 1 via an insulating base 17 and an electrode base flange 18. It is possible to move the processing electrode 14 up and down by an appropriate elevating mechanism (not shown) so as to vary the distance between the wafer 12 and the shower plate 3. The present invention can be applied regardless of whether such elevating mechanism is equipped.

RF power is applied to the processing electrode 14 from a second RF power supply 21 via a matching network 20 and a conductor protected by an insulating pipe 19, thereby applying RF bias to the wafer 12. As described, it is not necessary for the first RF power supply 4 and the matching network 28 to adopt the arrangement illustrated in the present diagram, and for example, the output thereof can be applied to the processing electrode 14 in parallel with the second RF power supply 21 and matching network 20. Further, it is possible to omit the first RF power supply 4, in which case the second RF power supply 21 works both to generate plasma 9 and to apply RF bias to the wafer 12.

The signal output from an oscillator 30 passes a phase controller 26, output from one output terminal of the phase controller and is input to the second RF power supply 21. The other output of the phase controller 26 sends out a signal having a controlled phase difference controlled with respect to the signal sent to the second RF power supply 21, and is input to a third RF power supply 25. The output of the third RF power supply 25 is passed through a matching network 24, mixed with the output from the first RF power supply 4 in a mixer 27, and applied to the upper electrode 2 (or shower plate 3).

The mixer 27 functions not only to mix the output from the first RF power supply 4 and the third RF power supply 25, but also as a filter for preventing the output of the first RF power supply 4 from entering the third RF power supply 25 and its matching network 24. Further, the mixer 27 functions as a filter for preventing the output of the third RF power supply 25 from entering the first RF power supply 4 and its matching network 28. As described above, RF bias can be applied to the opposing upper electrode 2 (or shower plate 3) and lower processing electrode 14 (or wafer 12) at equal frequency and with a controlled phase.

The frequency of the first RF power supply 4 is set normally to 13.56 MHz or greater, to around 2.4 GHz, in order to generate plasma. On the contrary, the frequency of the second and third RF power supplies 21 and 25 is set normally to 13.56 MHz or smaller, since the main object is to apply bias rather than to generate plasma.

The signal from a wafer potential probe 31 for directly measuring the potential of the wafer 12 being the lower electrode and the signal from a high voltage probe 32 for directly measuring the potential of the antenna 2 being the upper electrode are connected to the phase controller 26. These signals include the first RF voltage and the third RF voltage, so only the signal of the third RF voltage is taken out via a filter. The phase controller 26 carries out phase control of the signals output to the second and third RF power supplies 21 and 25 by detecting the phase difference of the measurement of these two probes. At this time, it is necessary that the phase shift caused by the signal transmission paths of the wafer potential probe 31 and the high voltage probe 32 is accurately calibrated. Therefore, the phase controller 26 is added with a function to cancel this phase shift.

By adopting the above-described function and arrangement, the phases of the upper and lower electrodes can be controlled with high accuracy, enabling the following functions to be controlled with higher accuracy than the conventional art: enabling either the upper or lower electrode to constantly function as earth; reducing the amount of generation of contaminants while enhancing the uniformity of plasma; and reducing charging damage.

Next, the wafer processing sequence using the plasma processing apparatus of FIG. 1 will be described. At first, the vacuum vessel 1 is evacuated by the evacuation device 11 to achieve a predetermined degree of vacuum. At this time, it is confirmed that the gas leakage from the process gas introduction pipe 7 or from the atmosphere into the vacuum vessel 1 is sufficiently low. At the same time, it is confirmed that the amount of out gas from components within the vacuum vessel 1 is also sufficiently low. In this state, the processing substrate (wafer) 12 is mounted on the processing electrode 14. Next, process gas is introduced into the vacuum vessel 1 through the process gas introduction pipe 7, and the vacuuming level is adjusted to control the pressure within to a level appropriate for the process.

After the above process starting conditions are fulfilled, the plasma 9 is ignited by supplying a predetermined power from the first RF power supply 4. At this time, the matching operation starting point is optimized using a preset function in advance, so as to minimize the time for stabilizing the operation of the matching network 28 and for the reflected wave from the antenna 2 to be sufficiently reduced. After confirming that the operation of the matching network 4 has stabilized and the plasma 9 is ignited, predetermined power supply is started from the second RF power supply 21 and the third RF power supply 25. The reason why power from second and third RF power supplies 21 and 25 is supplied only after confirming ignition of plasma 9 is because when no plasma is generated, the high load impedance causes high voltage to be generated at the antenna 2 and the processing substrate 12, which increases the possibility of erroneous operation of the apparatus due to abnormal discharge or noise. The timing for starting power supply from the second RF power supply and the third RF power supply should preferably be simultaneous. The object is to minimize rise time of the first, second and third RF power supply in order to shorten the processing time of the processing substrate, to minimize the time the processing substrate is exposed in plasma during the rise time of RF power supply (in other words, before starting the process), to minimize the deposition of reaction products from plasma on the processing substrate, and to realize the effect of phase-controlled bias application as much as possible from the starting of the process.

When the second RF power supply 21 and the third RF power supply 25 are turned on at the same time, the matching actions of the respective matching networks 20 and 24 affect each other, and may cause the matching operation time to be elongated. One example of the drawback caused thereby is the drastic change of plasma property, that is, the drastic change of load impedance of the RF power supply, caused by the matching operation. In this case, it is necessary to change the timing for starting power supply from the second RF power supply and the third RF power supply. In such case, the starting of power supply to the second RF power supply 21 that applies bias to the processing substrate 12 is prioritized. This is to prioritize the process itself and the reduction of damage to the processing substrate.

When starting the above-mentioned power supply from the second and third RF power supplies, the phase controller 26 will not perform phase control, but instead, is fixed to a predetermined phase angle according to a preset mode. This is because during matching operation of the matching networks 20 and 24, the phase angle is changed drastically, and there is no guarantee that correct phase control operation is carried out during matching operation. Of course, the match start position of the matching networks must be optimized using a preset function to minimize the time of stabilized operation from the starting of operation of the matching networks 20 and 24.

The phase controller 26 starts phase control after confirming that the power applied from the RF power supply has stabilized, that is, that the matching operation of matching networks 20 and 24 has stabilized. Moreover, in order to perform stable phase control operation, the phase angle of the preset mode is fixed to a desirable phase angle measured in advance. By adopting the above sequence, the rise time of RF power supply and the phase control operation can be minimized, and the processing of the processing substrate 12 can be started promptly.

Figure 2:
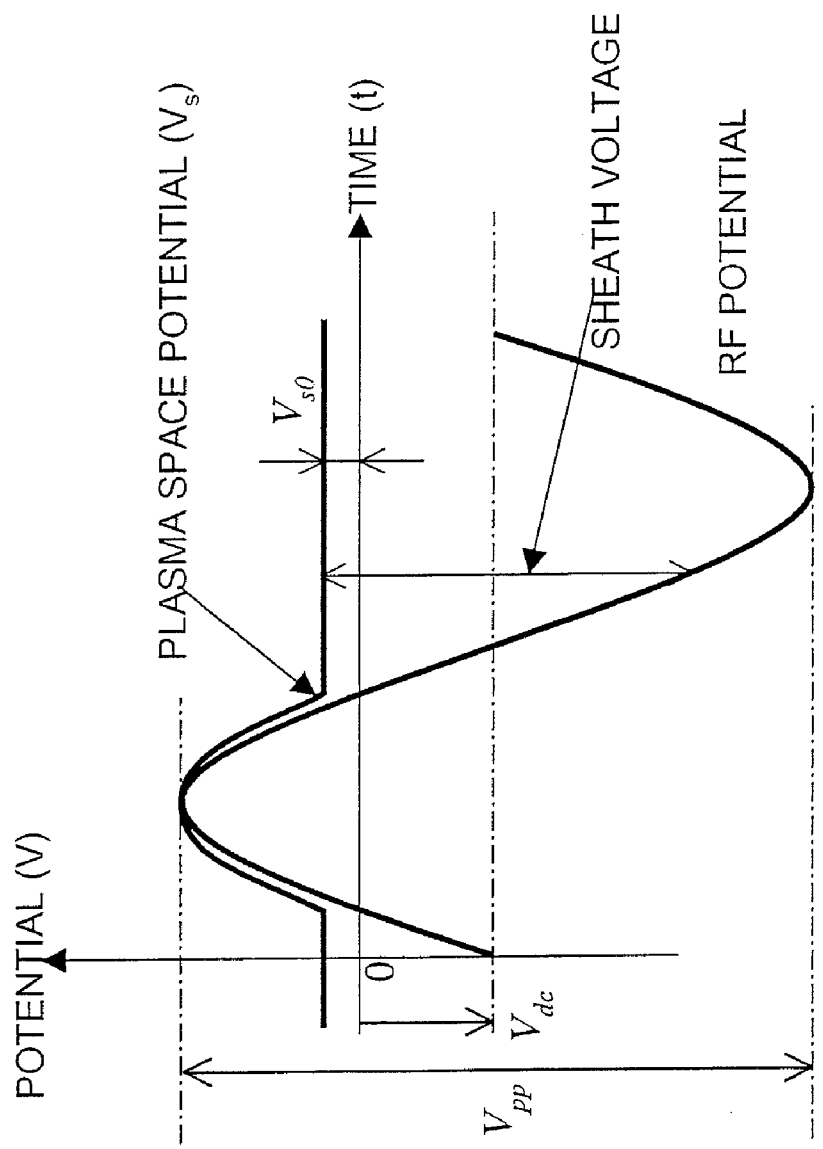
FIG. 2 is a graph showing the relationship between RF potential, plasma space potential and sheath voltage.

Next, with reference to FIG. 2, we will describe how RF bias is applied to the electrode. The phenomenon described here is caused qualitatively at both the upper and lower electrodes 2 and 14. FIG. 2 shows the relationship between the RF potential on the wafer substrate and the plasma space potential ($V_s$). The peak-to-peak voltage $V_{pp}$ and the self-bias voltage $V_{dc}$ of the RF potential waveform are defined in the drawing. The self-bias voltage $V_{dc}$ is the potential in which the sum of ion current and electron current flowing into the electrode from the plasma becomes zero within one RF cycle, and it is also the time average of the surface voltage of the electrode. On the other hand, the plasma space potential takes a constant value (defined as $V_{s0}$ in FIG. 2) when the RF voltage is sufficiently low, but when the RF voltage equals or exceeds the plasma space potential, it is dragged up along with the RF potential and substantially equals the RF potential at the maximum value of the RF potential. The reason why the plasma space potential is dragged up by the RF potential is because the plasma becomes ion rich since a large amount of electrons are drawn out of the plasma by the rise in RF potential. At this time, the ratio of $V_{dc}$ and $V_{pp}$ ($V_{dc}/V_{pp}$) is determined by the RF frequency and the impedance of the earth as seen from the wafer, and when the energy distribution function of the electrons in the plasma take a Maxwell distribution, the ratio is always $0 < V_{dc}/V_{pp} < 0.5$. The higher the RF frequency becomes, and the greater the impedance of the earth becomes, the $V_{dc}/V_{pp}$ approximates 0. In other words, $V_{dc}/V_{pp}$ is a value characteristic to the apparatus, and characteristic to the upper and lower electrodes.

Based on the description of FIG. 2, it is understood that there exists a moment within one cycle of RF when the plasma space potential rises when RF bias is applied to the electrode. This rise in plasma space potential is naturally transmitted through the plasma and reaches the earth. In other words, a part of the RF bias is transmitted in the plasma as the variation of plasma space potential. The transmission waveform is at least not a sine wave, as can be seen from the waveform shown in the plasma space potential of FIG. 2, and includes the bias frequency and its harmonics. The rise of plasma space potential accelerates the ions emitted from the plasma to the earth at ground potential. The accelerated ions cause sputtering of the wall and chemical reaction that eat away the wall, generating contaminants. On the contrary, if reaction products are deposited on the wall, the deposition of reaction products can be suppressed using sputtering and chemical reaction caused by these ions.

When RF bias is applied to each of the two upper and lower electrodes 2 and 14 shown in FIG. 1, the rise in plasma space potential caused at the surface of each of the electrodes are superposed within the plasma. Therefore, it becomes possible to control the rise of the plasma space potential by controlling the RF bias phase of both electrodes. This is described in detail in patent document 2.

Figure 3:
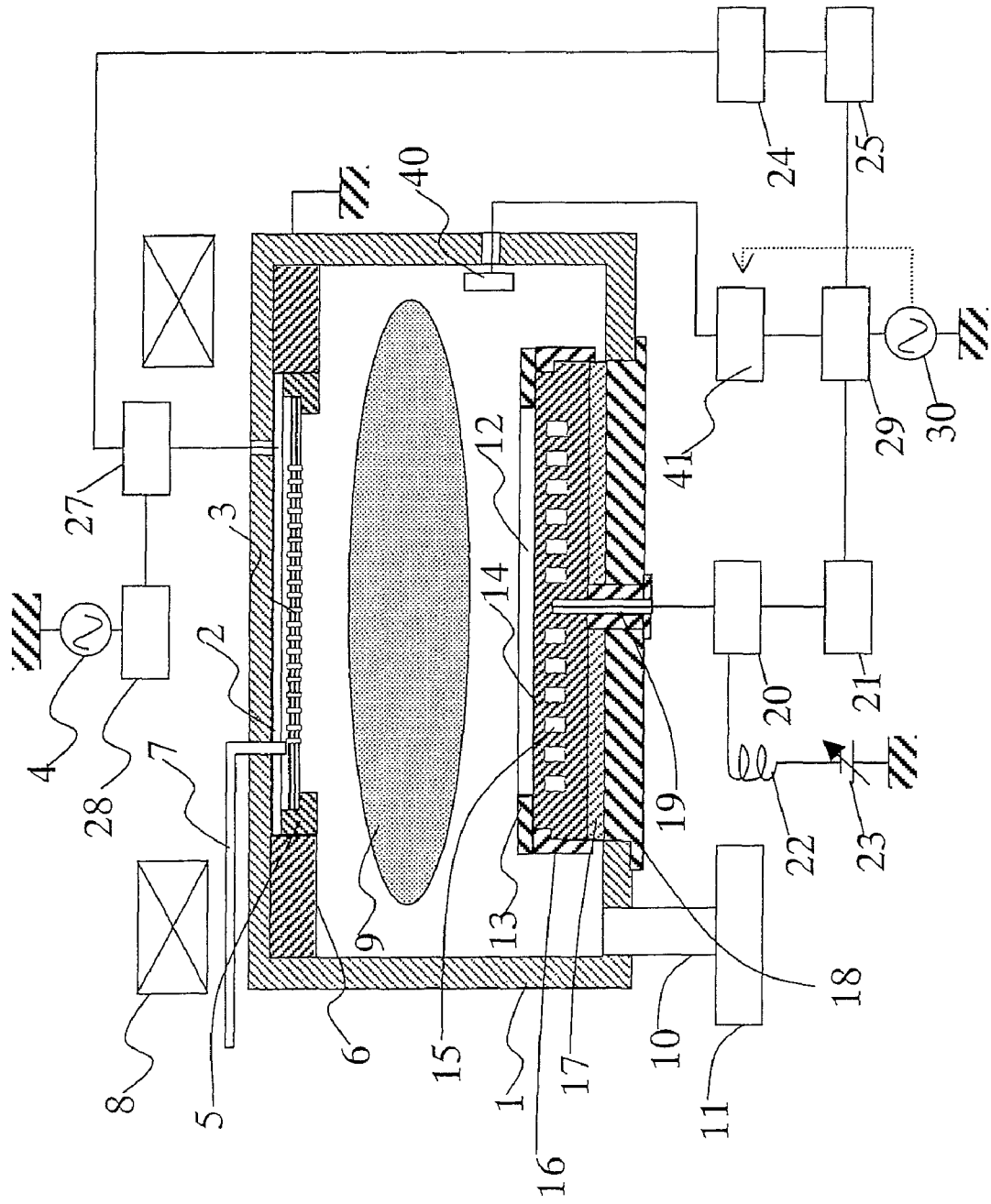
FIG. 3 is a schematic cross-sectional view showing the overall structure of a plasma processing apparatus according to a second embodiment of the present invention.

Based on the above fact, the present invention utilizes the RF transmitted in the plasma to perform phase control of the bias. In order to suppress the generation of contaminants, it is necessary to minimize the energy of ions accelerated toward the earth. Based on the above description, the conditions for realizing this is equal to that for minimizing the rise of plasma potential by the RF bias. The second embodiment of the present invention utilizes these conditions, and the schematic view of this embodiment is illustrated in FIG. 3.

In this embodiment, a microelectrode 40 is inserted near the vacuum vessel wall, for receiving the RF transmitted through the plasma. The signal generated in the microelectrode 40 includes the RF from the first, second and third RF power supplies 4, 21 and 25 and their harmonics, the plasma floating potential and noise components. It is possible to use an analog filter or a digital filter (such as fast Fourier transform) in order to detect the RF from the second RF power supply 21 and the third RF power supply 25 based on this signal, but in FIG. 3, an arrangement using a lock-in amplifier 41 is adopted.

A reference signal is provided from the oscillator 30 to the lock-in amplifier 41. It is preferable to adopt a two-phase lock-in amplifier as the lock-in amplifier. The output of the lock-in amplifier is equal to the ion energy being incident on the wall, as can be understood from the above description. The output of the lock-in amplifier is input to a phase controller 29 as a control signal.

The phase controller 29 has the function to minimize the output of the lock-in amplifier 41, that is, to control the phase so as to minimize the rise of plasma potential, or, to control the phase to take a specific value. To control to a specific value means to control the ion energy released from the plasma 9 onto the vacuum vessel wall to a certain status, and it also means to control the sputtering and chemical reaction on the wall surface by ions.

Figure 4:
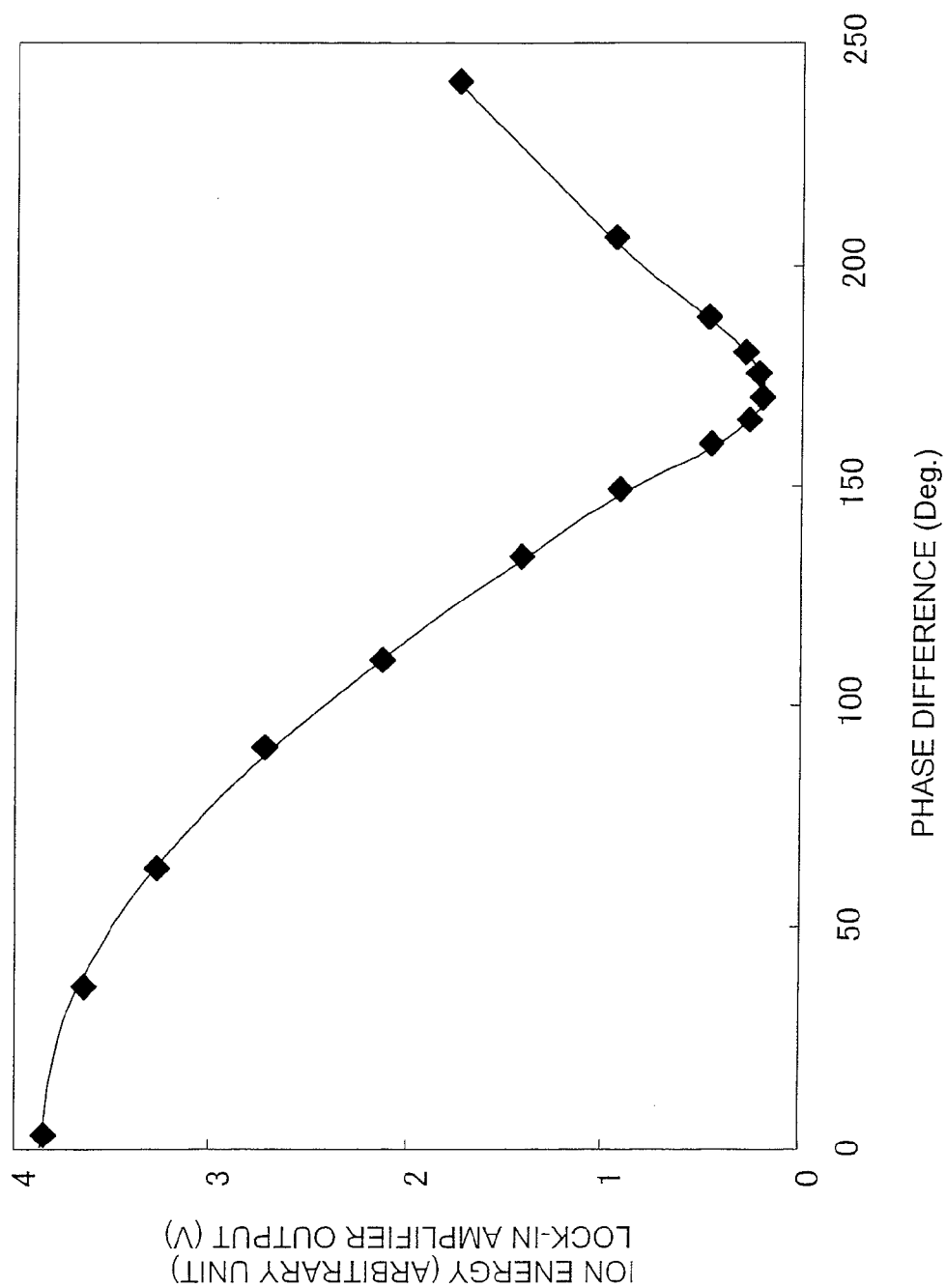
FIG. 4 is a graph showing the relationship between ion energy and phase difference.

FIG. 4 illustrates the dependency of output of the lock-in amplifier 41 to the phase difference based on the output of the phase controller 29. At this time, the frequency of second and third RF power supplies 21 and 25 is 4 MHz, and the power is 1 kW, respectively. It can be seen that the output of the lock-in amplifier 41 is minimized when the phase difference is close to 170 degrees. The reason why the output is not minimized at a phase difference of 180 degrees is because there is a difference between the phase shift (in other words, the circuit impedance) of the RF output from the second RF power supply reaching the microelectrode 40 via the matching network 20, the processing electrode 14, the wafer 12 and the plasma 9, and the phase shift output from the third RF power supply reaching the microelectrode via the matching network 24, the mixer 27, the antenna 2 and the plasma 9. Note that in general, the minimum value does not reach 0 V. This is because, as described above, since the impedance of the path through which the RF output from the second RF power supply is transmitted does not equal the impedance of the path through which the RF output from the third RF power supply is transmitted, the voltage swing when reaching the microelectrode 40 is not equal, and so there is no guarantee that the voltages become zero when superposed. Other causes are the difference in the amount of harmonics generated at the ion sheath on the surface of the upper electrode and the lower electrode, and the lock-in amplifier being incapable of completely removing the odd-order harmonics due to its operation principle.

By adopting the arrangement and method illustrated in FIG. 3, it becomes possible to reliably control the impact of ions on the wall. Further, there is a merit in that there is no need to adopt a high-level technique to measure the RF of high voltage applied to parts such as the wafer 12 or antenna 2, or to detect the phase between two RFs. Another merit of the present embodiment is that since a small signal output from the microelectrode 40 that can be handled easily is processed by the lock-in amplifier 41 having high S/N signal processing system, the reliability of the signal processing is enhanced, and the ease and reliability of signal handling is improved since the output of the lock-in amplifier is DC voltage.

Figure 5:
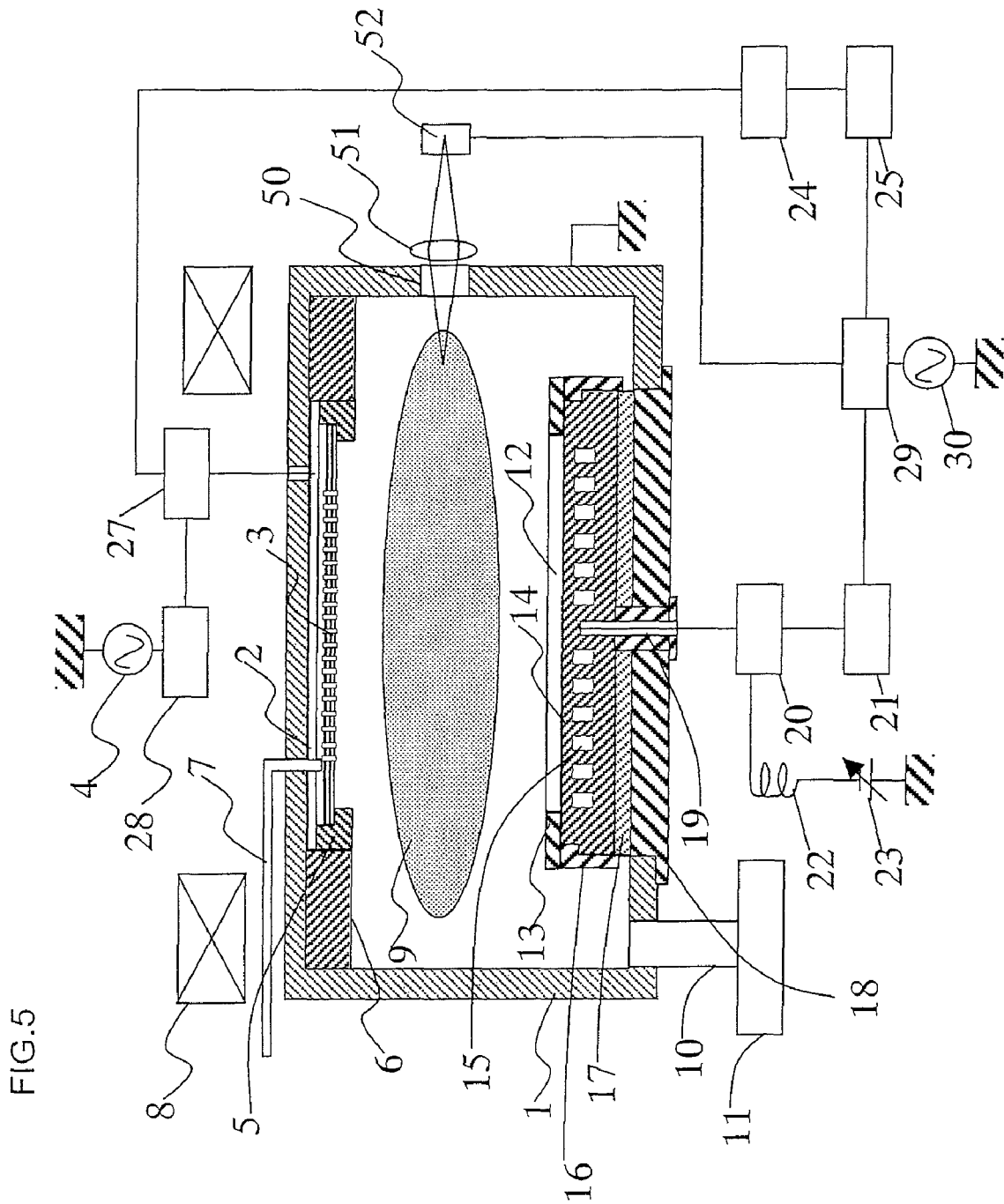
FIG. 5 is a schematic cross-sectional view showing the overall structure of a plasma processing apparatus according to a third embodiment of the present invention.

From the viewpoint of controlling the ion impact on the vacuum vessel wall, it is possible to adopt a means to detect the substances being released from the wall. The third embodiment of the present invention is made from this viewpoint, and the schematic view thereof is illustrated in FIG. 5. The substance released from the wall is subjected to collisional excitation in the plasma by electrons, and emits light of a wavelength specific to that substance. By collecting this light through a window and a collimator lens 51 to a spectroscope 52, the intensity of the wavelength specific to the substance can be obtained at the spectroscope 52. The emission intensity is used as a control signal for controlling a phase controller 29.

The arrangement of FIG. 5 was used to generate oxygen plasma (electron density: approx. $3 \times 10^{16}$ cm$^{-3}$, electron temperature: approx. 2.5 eV). Using an aluminum having an alumite treated surface (anodized aluminum surface) as the vacuum vessel 1, the phase of the phase controller 29 was changed and the emission intensity of aluminum generated by the wall of the vacuum vessel 1 being subjected to ion sputtering was detected, the result of which is shown in FIG. 6(a). It can be seen that when the phase difference was reduced from 180 degrees, the emission of aluminum increases rapidly when the phase difference was reduced to below 80 degrees. From the chart, it can be seen that the energy of ions colliding against the wall exceeded the sputtering threshold of alumite (anodized aluminum) at a phase difference of 80 degrees and smaller. From the above, it is understood that the sputtering of the aluminum wall can be suppressed by controlling the phase difference to, for example, 90 degrees or greater.

If a wafer is processed with plasma using CF-based gas (for example, $C_4F_8$) in the plasma processing apparatus of FIG. 5, a CF-based polymer is deposited on the wall of the vacuum vessel 1 as reaction product. This deposit is known to be the cause of contaminants on the wafer. With this deposit formed on the wall of the vacuum vessel 1, the above-mentioned oxygen plasma was generated to clean the wall. At this time, the carbon (C) of the deposition film on the wall reacts with oxygen to generate carbon monoxide (CO). Thereby, the deposition film on the wall is decomposed into gaseous components such as carbon monoxide, carbon dioxide and fluoride and vaporized, and thus the deposition film is removed.

The phase difference dependency of phase controller 29 with respect to the carbon monoxide emission intensity is shown in FIG. 6(b). Unlike the emission (396 nm) intensity of aluminum (Al) as shown in FIG. 6(a), the emission of carbon monoxide can be seen regardless of the phase difference value. This is because the generation of carbon monoxide is caused by chemical (combustion) reaction with oxygen, and so carbon monoxide is generated by the reaction with oxygen radicals in the plasma even when the ion energy is small. However, when the phase difference is reduced from 180 degrees, similar to the case of FIG. 6(a), the emission intensity of carbon monoxide will become higher. This is because the chemical reaction with oxygen is accelerated by the rising of temperature of the deposition film caused by increased ion energy.

Figure 7:
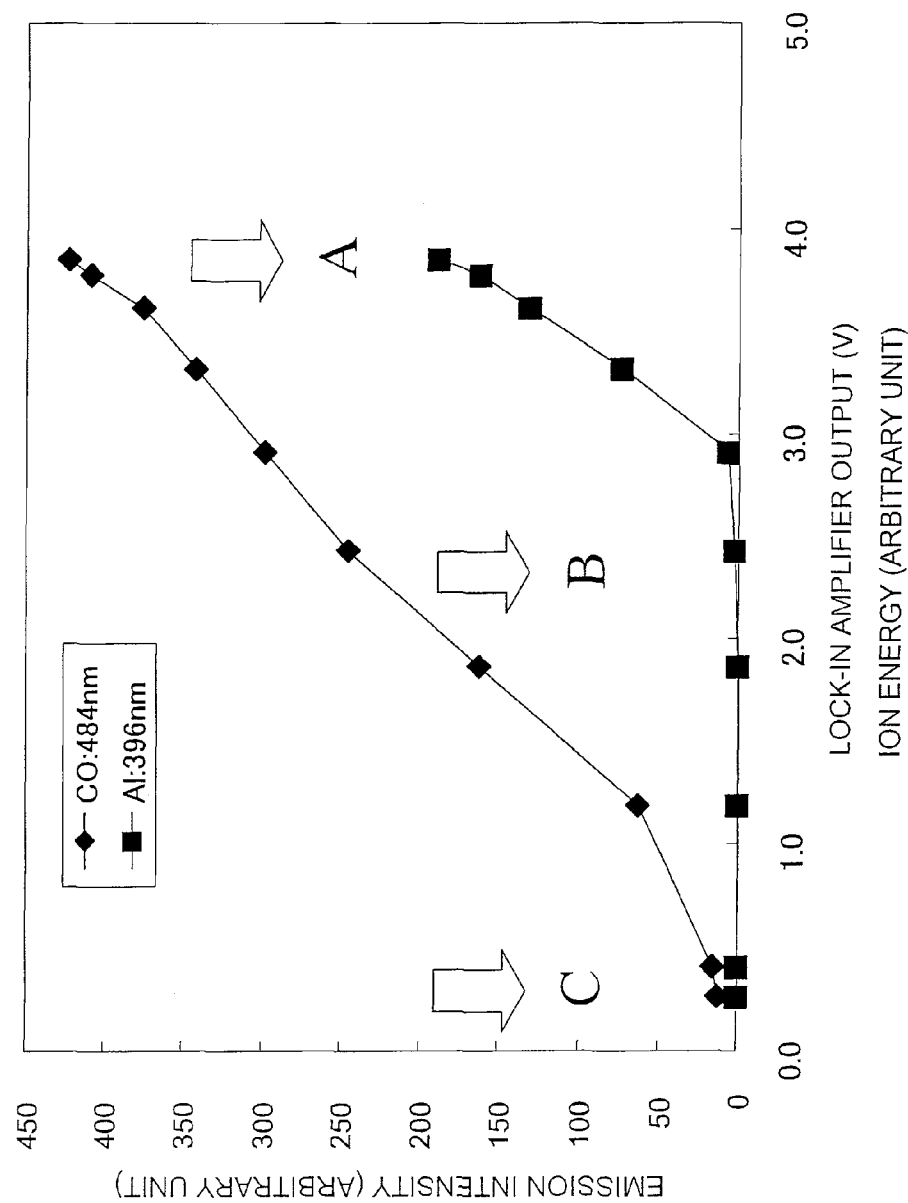
FIG. 7 is a graph showing the relationship between ion energy and emission intensity of aluminum and carbon monoxide.

With reference to the result shown in FIG. 4, the phase difference taken as the horizontal axis of FIG. 6 is equal to the output of the lock-in amplifier, and in the end, it can be replaced with ion energy. The result is shown in FIG. 7. What can be seen from FIG. 7 is that when carbon monoxide or aluminum is generated from the wall as a result of interaction with plasma, the amount or the existence of generation thereof is dependent on the ion energy. By utilizing the result of FIG. 7, the removing of the deposition film formed on the wall can be performed effectively. When there is a large amount of deposition film formed on the wall, the phase difference should be controlled so that the output of the lock-in amplifier corresponds to arrow A of FIG. 7. Thereby, the deposition film can be removed rapidly and effectively. The surface of the wall is exposed when the removal of the deposition film progresses. In this condition, the emission of aluminum being the wall material will be seen, so it is possible to detect the exposure of the wall surface at once. When the exposure of the wall surface is detected, the phase difference should be controlled so that the output of the lock-in amplifier corresponds to arrow B, so as to prevent the wall material from being eaten away. Thus, the removal of the deposition film can be performed speedily without having the wall surface eaten away. When the removal of the deposition film is progressed further, the deposition film is reduced and the emission intensity of carbon monoxide is reduced. When the emission intensity is reduced to below a certain value, it is possible to determine that the deposition film removal has been completed. In other words, the end point determination of the deposition film removal becomes possible. After completing the deposition film removal, the phase difference can be set to an arbitrary value according to the object thereafter. For example, it is possible to set the phase difference to correspond to arrow C where ion impact to the wall is minimized. The step of removing the deposition film should preferably be performed at an arbitrary interval set in advance, and for example, it can be set arbitrarily according to the number of wafers to be processed, or can be set arbitrarily according to the wafer processing time.

The relationship between the ion energy and the output of the lock-in amplifier 41 depends on the signal processing system of the microelectrode 40 or the lock-in amplifier 41. In other words, the value is specific to the apparatus. Furthermore, the relationship between the emission quantity and the phase difference (or output of the lock-in amplifier) as shown in FIGS. 6 and 7 depend on the processing conditions such as the structure of the wafer 12 to be processed and the gas being used. Accordingly, by collecting in advance the data shown in FIGS. 4, 6 and 7, it becomes possible to acquire a control signal that is most suitable for the apparatus and the process.

As mentioned, it can be understood that the ion energy providing impact on the wall or the substance generated from the wall can be controlled by combining the signal equivalent to the ion energy shown in FIG. 3 and the signal showing the amount of substance generated from the wall shown in FIG. 5. This is equal to controlling the status of the wall surface, and according to the present invention, it becomes possible to realize a vacuum vessel wall environment most suitable for the processing of the wafer.

The ion energy dependency of the generation of substance on the wall is not restricted to carbon monoxide and aluminum, but any substance will have a dependency specific to that substance. Further, the dependency specific to that substance itself will vary according to the plasma being used. Therefore, the most effective wall surface control can be performed by selecting the most suitable signal upon removing the deposition film on the wall or when processing the wafers. Of course, this function contains various functions such as reducing the vacuum drawing time of the equipment after releasing the vacuum vessel to the atmosphere by accelerating the emission of moisture or gas components such as nitrogen adhered on the wall, and effectively removing process inhibiting factors of the subsequent process by performing effective removal of the gas components such as fluoride and chloride absorbed on the wall during the previous process.

Furthermore, the signal equivalent to the ion energy mentioned here is not restricted to the RF voltage signal illustrated in FIG. 3, but can be other signals such as the ion energy analyzer signal or the plasma floating potential signal as long as it is equivalent to the ion energy. Further, the signal indicating the substance generated from the wall is not restricted to the emission intensity of the substance, but can be other signals such as the signal from a mass spectrograph as long as it indicates the substance being generated from the wall.

Even further, a high-level control of the wall status is made possible by simultaneously providing the device outputting the signal equivalent to the ion energy as shown in FIG. 3 and the device outputting the signal indicating the amount of substance being generated from the wall as shown in FIG. 5.

Figure 8:
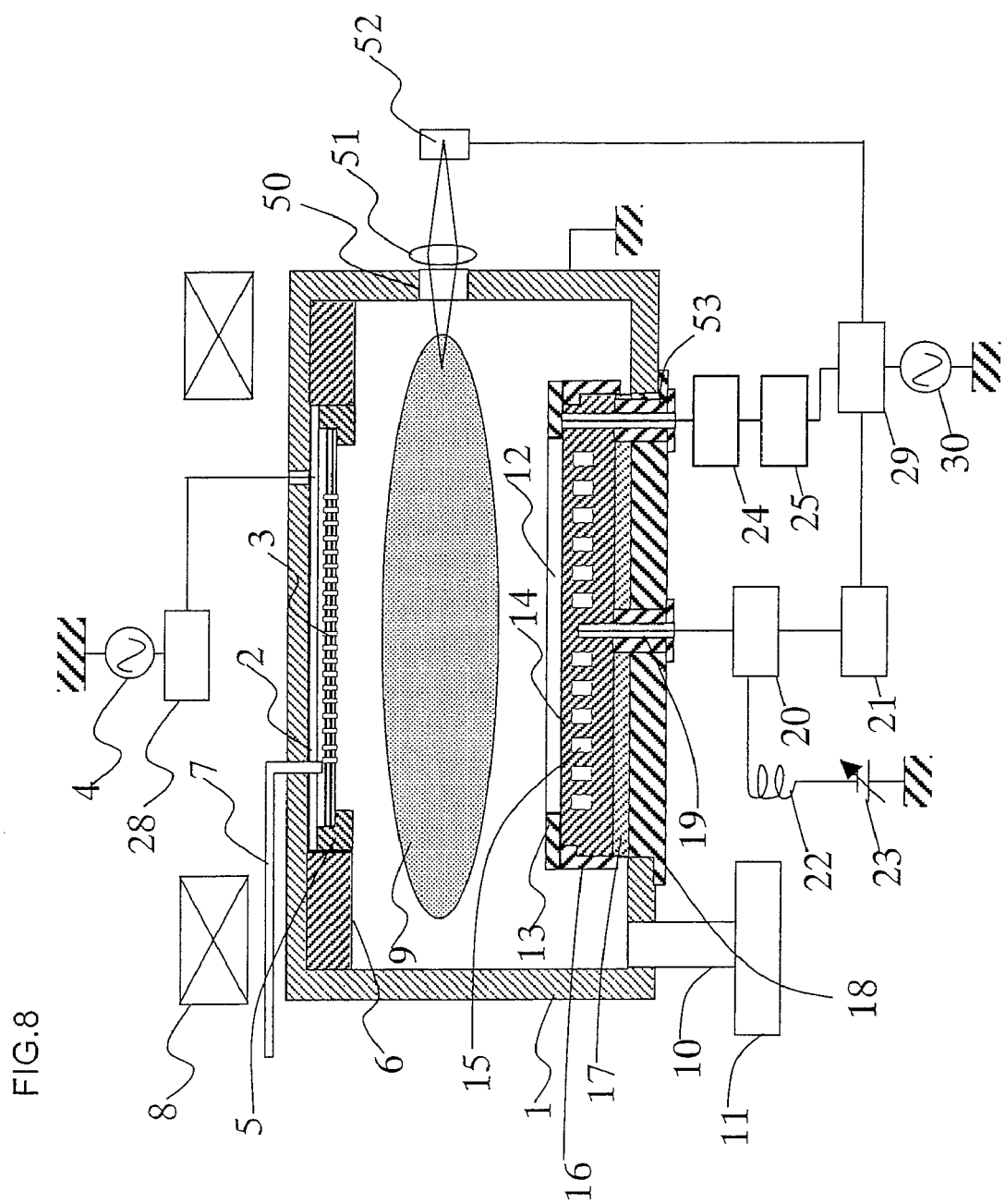
FIG. 8 is a schematic cross-sectional view showing the overall structure of a plasma processing apparatus according to a fourth embodiment of the present invention.

The functions mentioned here can be realized without being restricted to the example of carrying out phase control of upper and lower electrodes of a parallel plate plasma source as illustrated in FIG. 1. The required condition is the existence of two independent RF radiation units that are capacitively coupled with plasma, and the functions of the present invention are realizable by applying phase-controlled RFs to the two RF radiation units. The RF radiation unit mentioned here refers to a structure that contains plasma as one part of the load of the RF radiation unit in an RF-related equivalent electric circuit containing this RF radiation unit. Even if this structure is not intended to be capacitively coupled with plasma, as long as it is coupled with plasma by stray capacity, it can be contained in the RF radiation unit described here. According to this definition, the wafer 12 illustrated in FIG. 1 is defined as RF radiation unit. The following invention was made with focus on the fact that many RF radiation units other than the wafer or the plasma generating electrodes exist in the plasma processing apparatus. FIG. 8 illustrates an example in which the output of the third RF power supply is applied to a focus ring 13 next to the processing substrate 12 instead of the antenna 2. If the focus ring 13 is formed of a conductor or a semiconductor, the effect of phase control described above can be realized using the arrangement of FIG. 8. Further, even if the focus ring 13 is a conductor or a semiconductor that is covered with an insulating material, as long as the impedance of the insulator is small and the output of the third RF power supply is radiated to plasma 9, the effect by phase control can be realized.

Figure 9:
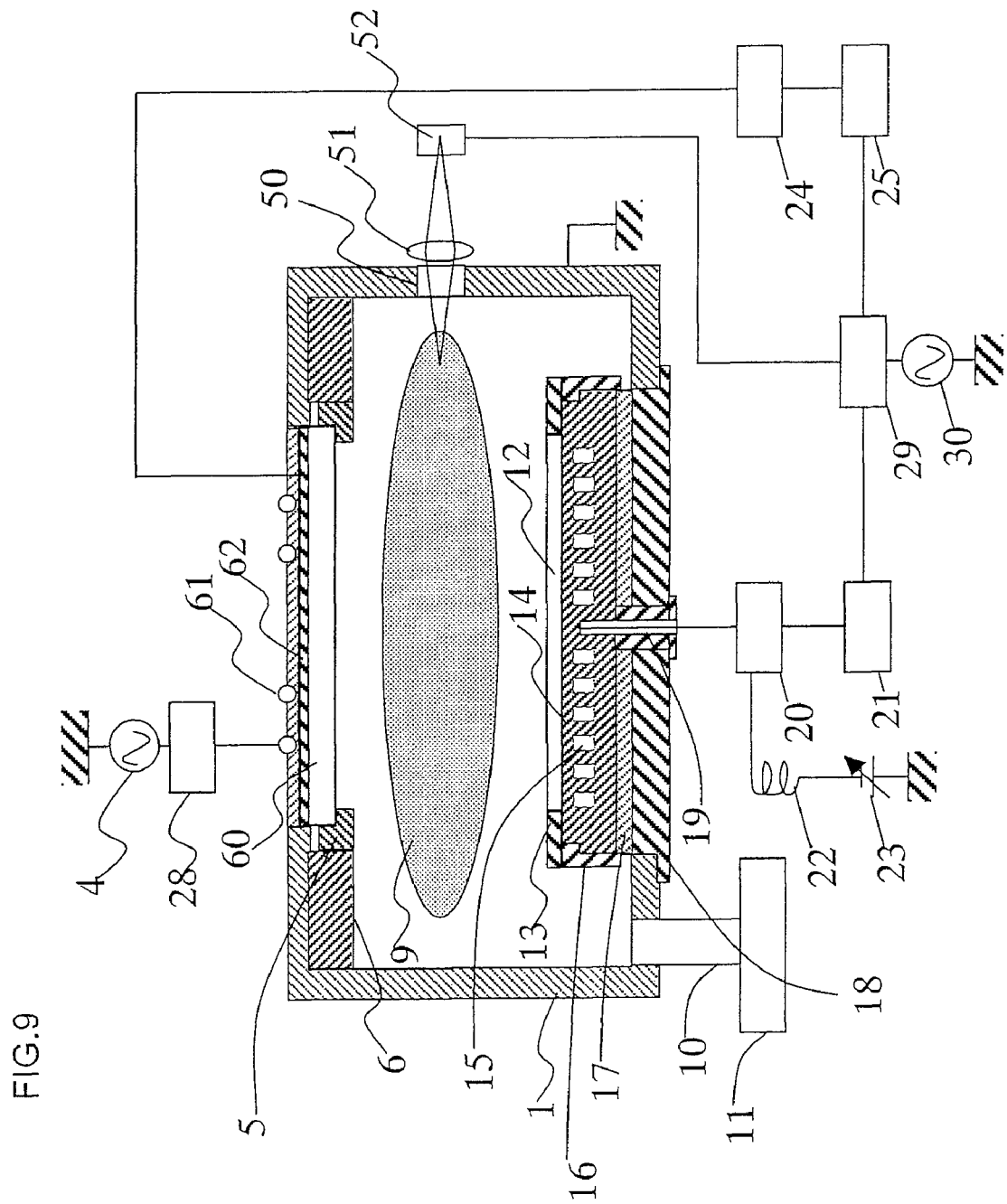
FIG. 9 is a schematic cross-sectional view showing the overall structure of a plasma processing apparatus according to a fifth embodiment of the present invention.

FIG. 9 illustrates a so-called inductively-coupled plasma source having an arrangement in which the power radiation system equipped with a coil antenna 61 and a Faraday shield 62 are separated from a vacuum portion with a dielectric window 60. Even according to this arrangement, the Faraday shield 62 is capacitively coupled with plasma 9, so the power from the third RF power supply 25 is supplied thereto to realize the effect of phase control. As can be recognized from this example, the effect of phase control can be realized by the existence of an antenna (electrode) radiating the power from the third RF power supply 25, and in such case, the effect of phase control can be realized using any plasma source other than the parallel plate-type capacitive coupled plasma source as shown in FIG. 1.

Figure 10:
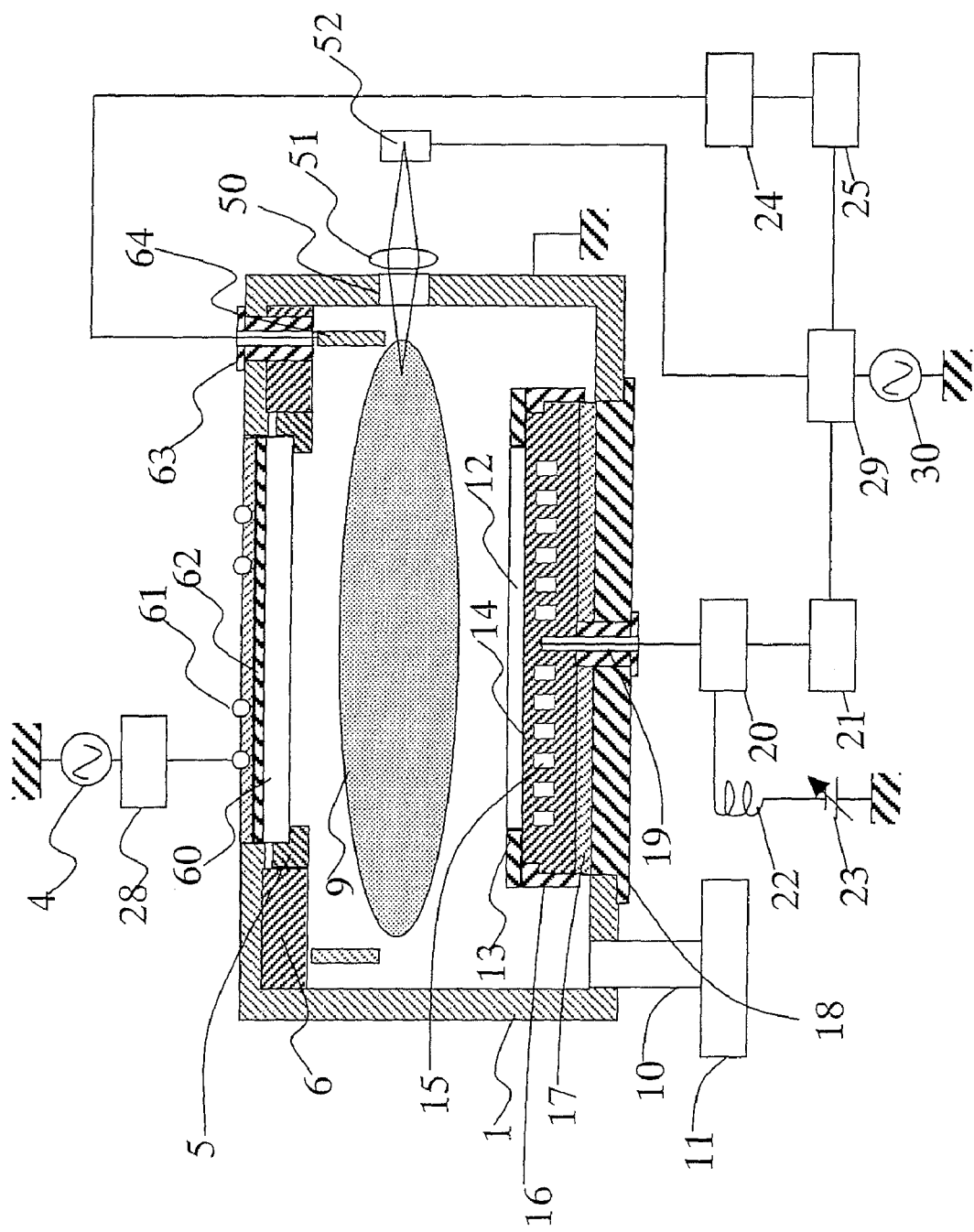
FIG. 10 is a schematic cross-sectional view showing the overall structure of a plasma processing apparatus according to a sixth embodiment of the present invention.

For example, as illustrated in FIG. 10, even by adopting the same inductively coupled plasma source shown in FIG. 9, if an electrode 64 that is capacitively coupled with plasma is disposed within vacuum, the power from the third RF power supply can be supplied to this electrode via an insulating tube 63 to realize the effect of phase control. The present RF radiation unit can be formed of any of the following: the parallel-plate electrode antenna, the focus ring, the Faraday shield or other electrodes. It can also be formed of a combination of any of the following: the parallel-plate electrode antenna, the focus ring and other electrodes; or the Faraday shield, the focus ring and other electrodes.

The present invention can be applied generally to substrate processing and processing apparatus using plasma. Possible processing apparatuses and processes include plasma CVD apparatus and CVD process, plasma ashing apparatus and ashing process, and plasma sputtering apparatus and sputtering process. Further, the present invention can be applied regardless of the plasma generating means being used. The possible plasma generating means include an inductively coupled plasma generating unit, a capacitive coupled plasma generating unit, an electron cyclotron resonance plasma generating unit, a helicon plasma generating unit, a surface wave discharge plasma generating unit, and a magnetron plasma generating unit. Moreover, the processing substrate can include a semiconductor wafer, a dielectric wafer represented by quartz, an LCD substrate and a conductive wafer represented by AlTiC.

What is claimed is:
1. A method for controlling a plasma processing apparatus that comprises:
   a vacuum vessel in which plasma is generated;
   a first RF power supply, a second RF power supply and a third RF power supply provided outside the vacuum vessel;
   a first electrode disposed either inside or outside the vacuum vessel to which a first RF voltage from the first RF power supply is supplied;
   a second electrode disposed inside the vacuum vessel, having an upper surface on which a sample is mounted, and to which a second RF voltage from the second RF power supply is supplied;
   an RF radiation unit other than the second electrode that is capacitively coupled with the plasma generated inside the vacuum vessel to which a third RF voltage from the third RF power supply is supplied;
   means for detecting a potential of the RF being transmitted through the plasma at an inner wall surface of the vacuum vessel;
   means for detecting an emission status of the plasma within the vacuum vessel;
   and
   a phase control unit for controlling a phase difference between the second RF voltage and the third RF voltage from the third RF power supply;
   wherein the controlling method comprises the steps of:
   controlling the phase difference between the RF voltage of the second electrode and the third RF voltage having a same frequency using a signal source other than a phase signal, disposed between the second electrode and the RF radiation unit that is capacitively coupled with the plasma;

wherein when removing a deposition film inside the vacuum vessel, controlling the phase difference according to an amount of the deposition film; and wherein the signal source other than the phase signal includes one of an RF voltage, a plasma emission, and a combination of the RF voltage and the plasma emission.

* * * * *